United States Patent [19]
Dean

[11] Patent Number: 6,122,302
[45] Date of Patent: Sep. 19, 2000

[54] AUTOMATIC COMPENSATION OF CNR AND OMI IN A LASER TRANSMITTER

[75] Inventor: Alon Dean, San Jose, Calif.

[73] Assignee: Harmonic Inc., Sunnyvale, Calif.

[21] Appl. No.: 08/987,873

[22] Filed: Dec. 10, 1997

[51] Int. Cl.[7] .............................. H01S 3/00; H04B 10/00
[52] U.S. Cl. ............................ 372/38; 372/29; 372/31; 372/33; 372/26; 359/154; 359/161
[58] Field of Search .................................. 372/29, 31, 33, 372/38, 26; 359/154, 173, 161, 180, 181, 188

[56] References Cited

U.S. PATENT DOCUMENTS

| | | | |
|---|---|---|---|
| 4,745,610 | 5/1988 | Yoshikawa | 372/38 |
| 5,019,769 | 5/1991 | Levinson | 372/31 |
| 5,043,992 | 8/1991 | Royer et al. | 372/38 |
| 5,812,572 | 9/1998 | King et al. | 372/38 |

OTHER PUBLICATIONS

K. R. Shastri et al., "1.2 Gb/s Integrated Laser Driver With Temperature Compensation For Modulation Current", IEEE 1991 Custom Integrated Circuits Conference, 1991, pp. 27.5.1–27.5.4.

*Primary Examiner*—Brian Healy
*Attorney, Agent, or Firm*—Skjerven Morrill MacPherson Franklin & Friel; Norman R. Klivans; George Wolken, Jr.

[57] ABSTRACT

A laser transmitter used in an optical communication system provides automatic compensation/stabilization of CNR (carrier to noise ratio) and OMI (optical modulation index) in conditions that would have caused these parameters to change if the compensation circuitry was not employed. The compensation circuitry is an open loop that operates in conjunction with a conventional APC (automatic power control) loop. When certain parameters change (i.e., temperature, laser aging, intentional change in optical power) they will affect the laser DC current (either directly or because of the existence of the APC loop) and as a result the CNR/OMI will change. The compensation circuitry senses the change in the laser DC current and changes the modulating current to the laser as required to minimize changes in CNR/OMI.

10 Claims, 4 Drawing Sheets

Key to

AUTOMATIC COMPENSATION OF CNR AND OMI IN A LASER TRANSMITTER

BACKGROUND

1. Field of the Invention

This invention relates to optical communications and more specifically to laser transmitters and to compensation for the effects caused by changes in laser current; these changes can be the result of temperature changes, aging or operating intentional changes.

2. Description of the Prior Art

When temperature increases or when a laser ages, the quantum efficiency of light emission (called also slope efficiency—$\eta$) from a laser is reduced, and as a result more DC (direct current) needs to be provided to the laser to obtain the same amount of optical power from the laser.

This task of maintaining constant optical power is performed by an APC (Auto Power Control) loop that is connected externally to the laser package (which includes a laser diode and a photo-diode which receives a fraction of the laser light). As the temperature (for instance) increases, the APC loop sends more current through the laser and since the information bearing signal modulating the laser is constant, the Optical Modulating Index (OMI=m [%]) is reduced, as seen from the formula $m=I_{mod}/(I_{DC}-I_{th})$, where $I_{mod}$=modulation current and $I_{th}$=threshold current. The CNR (carrier/noise ratio) at the output of the receiver that detects the optical power is proportional to $m^2$ and therefore decreases.

The amount by which the OMI and CNR decrease depends on the laser and its slope efficiency behavior over temperature. If the slope efficiency at high temperature is for example half its value at low temperature the CNR will drop by 6 db:

$$\Delta(CNR)=20\log(m_2/m_1)$$

It has been found that slope efficiency falls by a factor of 1.5 to 2 at 85° C. compared to its value at 25° C., and the corresponding drop in CNR is 3.5 to 6 db.

Several prior solutions to this problem have been proposed, as follows:

1. External temperature sensing and temperature control.

This solution does not compensate for slope efficiency changes over temperature but prevents (or minimizes) them by controlling the temperature of the laser. The way the temperature is controlled is as follows: a temperature sensor (i.e. thermistor) is located close to the laser such that its temperature is as close as possible to the laser temperature. A power resistor is located close to the laser and thermally conductive epoxy couples the thermistor, the laser and the power resistor.

A circuit is connected to these elements such that whenever their temperature goes below a certain threshold, a driver sends current to the power resistor and heats it up, the conductive epoxy transfers the heat to the laser and the thermistor and they heat up also. This process continues until the temperature of the thermistor (and therefore the laser) is slightly above the threshold. This method is good when the ambient temperature (and therefore the laser temperature) is below the threshold temperature because the circuit only needs to send power to the laser and thereby heats it up. The problem is when the ambient temperature is above the threshold temperature, in this case the laser is warmer than it should be and it needs to be cooled down. The problem is that the system cannot cool down at all. The solution to this shortcoming is to make the threshold temperature high enough such that it is above the highest possible ambient temperature. This ensures that always one adds power to the laser and there is no need to cool it down.

There are three problems with this solution:

a) The laser operates constantly at high temperature so its life expectancy is shorter.

b) The laser is operated at fixed slope efficiency but a low one, therefore more DC current and more modulating current are needed.

c) Lasers suffer from some other non-idealities at high temperature (e.g. more distortion, more noise) and since they are operated according to this solution at high temperature, the specifications might be adversely affected.

2. Cooled laser with internal thermo-electric cooler

This uses a laser mounted on a thermo-electric cooler that either can heat up or cool down the laser to a desired fixed temperature regardless the ambient temperature. The result is that the slope efficiency is fixed and so are OMI and CNR.

The disadvantage of this solution is that the laser with the cooler is much more expensive and the external circuitry is also more complicated and expensive.

SUMMARY

In accordance with this invention, e.g. at high temperature, the laser transmitter slope efficiency drops and as a result the APC increases the DC drive current to keep the optical power constant. This reduces CNR. To overcome this, one adds a second control loop (called a CNR stabilization loop), as described in detail below, that senses a change in laser DC supply current and therefore changes the modulating current supplied to the laser as required to keep CNR constant. This CNR loop includes a laser current sensor (e.g. resistor) which outputs a voltage signal indicative of the amount of DC current supply to the laser. This voltage is coupled to an attenuator controller which amplifies this signal and the amplified signal in turn drives an attenuator (e.g. PIN diode attenuator) which attenuates the modulating input (RF) signal. This attenuated modulating input signal is coupled to a modulation amplifier which in turn provides the modulation current to drive the laser.

Temperature change is used as an example to demonstrate the effectiveness of the invention, but it can be very effective in other situations that affect the laser current (e.g. laser aging, or optical power change by the user).

In accordance with the invention, CNR stays constant over e.g. temperature. Prior art laser transmitters with uncooled lasers do not have any compensation for CNR drop at high temperature, and compared to them the present advantage in CNR can be as much as 6 db.

Compared to the prior temperature control method, advantages of the present approach are that the laser is operated on average at lower temperatures and therefore has longer lifetime, less noise, and less distortion. Also in the present approach there is no need for costly manual work associated with mounting a power resistor on the laser and thermally coupling (with thermally conductive epoxy) the laser, thermistor and the power resistor. Replacing one of the parts in this "glued triangle" structure is very labor intensive and therefore expensive. Compared to the cooled laser with an internal thermo-electric cooler, an advantage of the present approach is lower cost, since a cooled laser is much more expensive than an uncooled laser and the driver needed to drive the thermoelectric cooler increases the cost even more. In contrast, the cost of the components for the present CNR compensation circuitry is very low.

DETAILED DESCRIPTION

Figure 1:
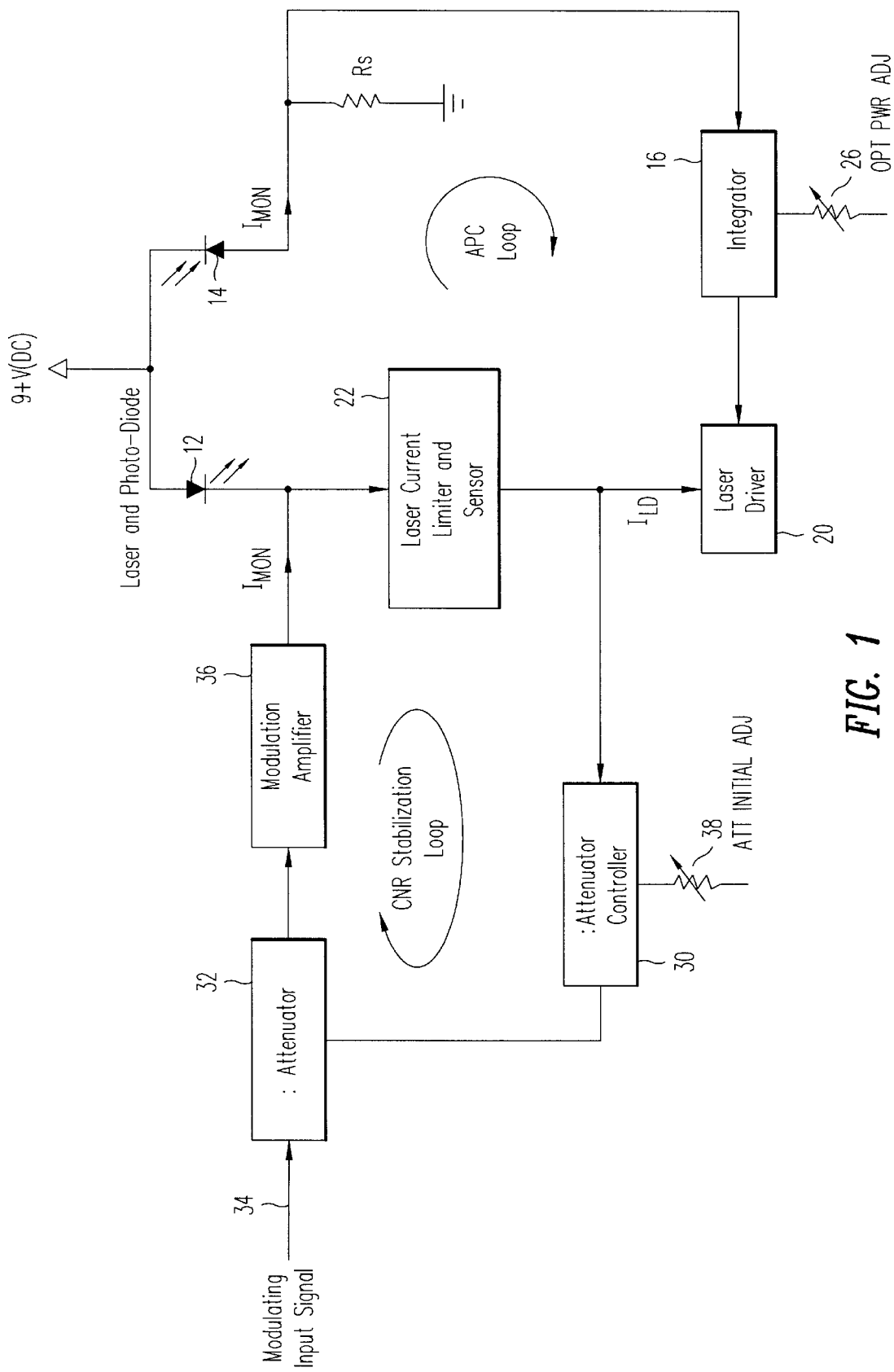
FIG. 1 shows a block diagram of an apparatus in accordance with this invention.

FIG. 1 shows a block diagram of a apparatus in accordance with this invention which is a laser transmitter which includes the conventional APC loop and also a second CNR stabilization control loop. It is to be appreciated that FIG. 1 shows only the laser transmitter portion of an otherwise conventional communications system which includes the laser transmitter, whose optical light beam output is coupled to an optical fiber. The distal end of the optical fiber is coupled to a conventional receiver. Such systems are typically used for transmitting wideband signals. Typically the modulation input signal to the laser transmitter is an RF signal, for instance a television signal or a wideband data signal. The present invention is directed to what is generally referred to as a directly modulated laser transmitter where the modulation (information bearing) signal drives the laser itself so that the laser outputs a light beam carrying the analog modulation signal.

Two control (feedback) loops are in the apparatus of FIG. 1; one loop is the APC (Automatic Power Control) loop that keeps the optical output power constant regardless of temperature, variations in part values, supply voltage and the laser's slope efficiency ($\eta$). The APC control loop includes a laser (e.g. laser diode) 12 and associated photodiode 14; these are available as a single device from Fujitsu, part number FLD312JP/581. Both laser diode 12 and photodiode 14 have DC voltage source +V. Resistor $R_s$ is provided to convert the photodiode current $^{MON}$ into a voltage. This voltage is coupled to conventional integrator 16. Integrator 16 supplies a control signal to conventional laser driver circuit 20 which sources current $I_{LD}$ to laser 12 via a current limiter and sensor (e.g. a resistor) 22. The APC loop is present conventionally in most laser transmitters and usually includes a potentiometer 26 for manual optical power adjustment. When the temperature increases, the laser's slope efficiency goes down and the optical power goes down. The APC loop senses the optical power reduction and prevents it by increasing the DC current ILD to the laser 12. It can be said that the laser DC current $I_{LD}$ is inversely proportional to the slope efficiency:

$$I_{LD} \times \eta = P_{opt} = \text{constant}.$$

Thus by sensing the laser DC current $I_{LD}$ the circuit is actually sensing the slope efficiency.

The second control loop in FIG. 1 is the CNR temperature stabilization loop, this loop keeps the CNR (and approximately OMI) constant when the slope efficiency falls due to temperature increases. The CNR control loop includes the current sensor 22, attenuator controller 30, attenuator 32, and modulation amplifier 36. The modulating input signal is e.g. an analog RF signal coupled to input terminal 34 of attenuator 32. Attenuator 32 may be any suitable attenuator, e.g. PIN or otherwise; one suitable attenuator includes the well known T-type PIN diode attenuator. Attenuator 32 has a constant (e.g. 75 ohm) input impedance at its RF terminal 34.

The temperature stabilization is accomplished in the following manner. At room temperature a second potentiometer 38 is initially adjusted such that the attenuator 32 provides e.g. 6 db of attenuation. It should be noted that the set point of potentiometer 38 is different for each transmitter because each has different slope efficiency at 25° C. and therefore different DC current.

When temperature increases, slope efficiency goes down and the APC loop increases the direct current supplied to the laser 12. The CNR loop, which senses this increase in the laser direct current, in response decreases the attenuation provided by the attenuator 32 and as a result the modulating current $I_{mod}$ to the laser 12 increases and compensates for the drop in slope efficiency that otherwise results in lower CNR. Modulation amplifier 36 amplifies the output signal from attenuator 32 and is e.g. a conventional push-pull amplifier that cancels out second order harmonics.

Figure 2A:
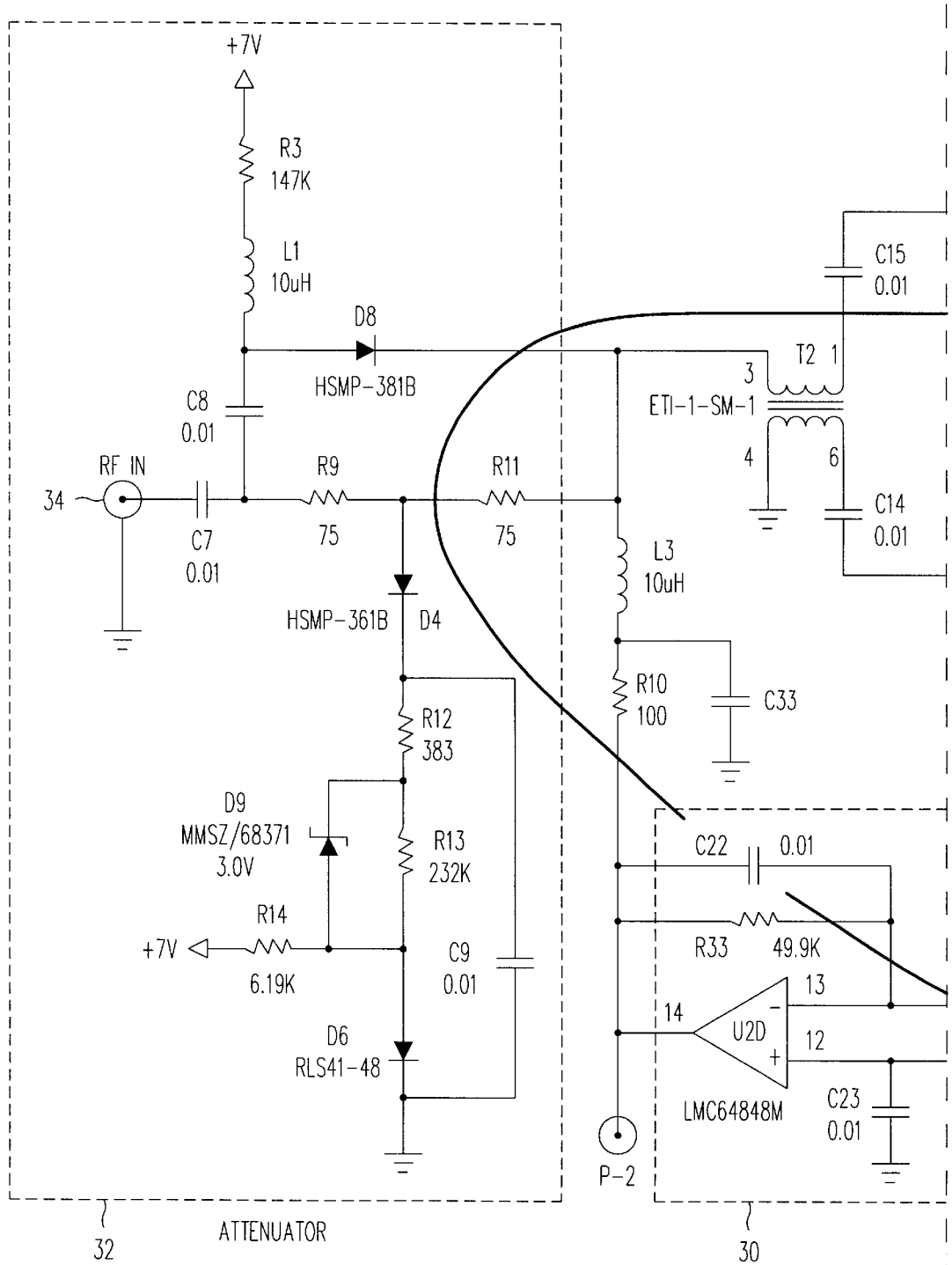
FIG. 2 shows detail of the apparatus of FIG. 1.
Figure 2B:
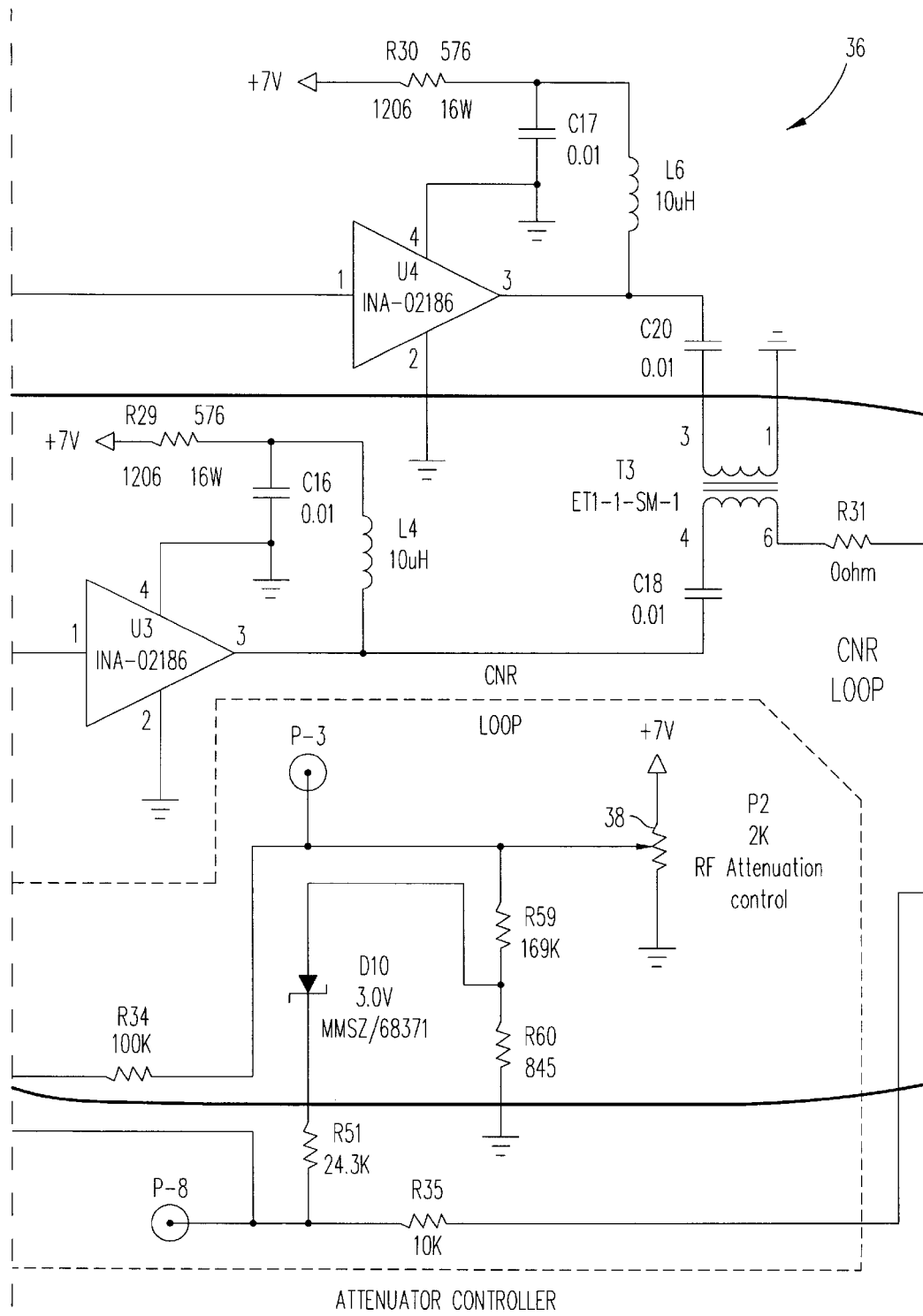
Figure 2C:
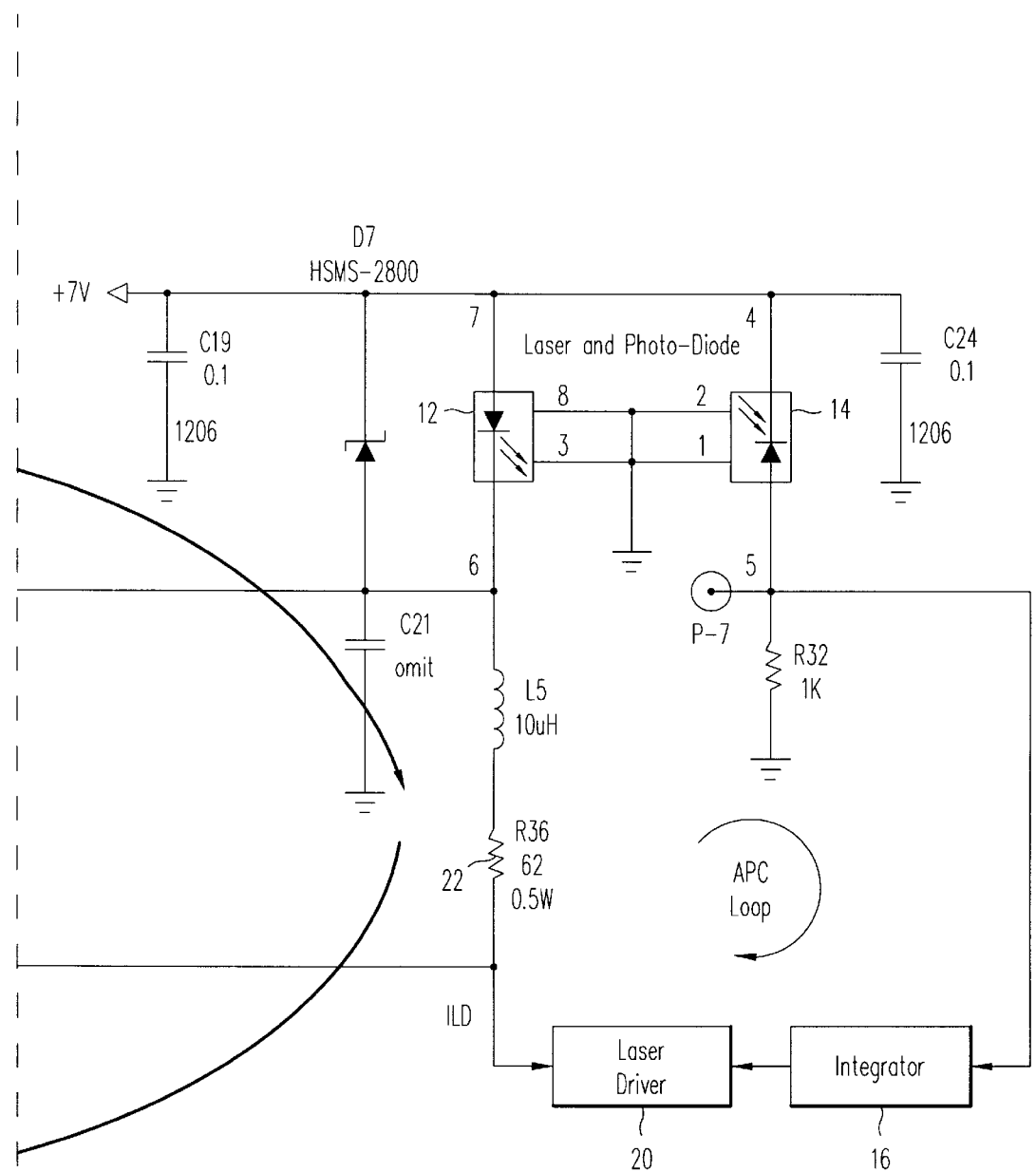
Figure 2:
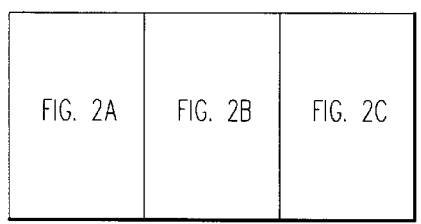

Detail of the FIG. 1 circuit is shown in one embodiment in FIG. 2, where similar elements have identical reference numbers.

The APC loop In FIG. 2 keeps the monitor current ($I_{mon}$) from the photo detector 14 constant (by equalizing it to a reference) regardless of temperature or laser aging. This is done automatically by controlling the laser direct current $I_{LD}$. If the tracking error between the laser 12 and the photo detector 14 is zero or small, then a constant monitor current means a constant optical power from the laser 12.

The CNR loop changes the modulation current to the laser 12 depending on the laser direct current (which is inversely proportional to the slope efficiency of the laser). Inductor L5 ensures that RF current will be directed to the laser 12 only. The voltage at the lower end of resistor R36 (which is current sensor 22) is proportional to the laser direct current. Amplifier U2D in controller 30 converts this voltage into a control voltage ($V_{TP-2}$) supplied to the attenuator 32. The modulating input signal (at terminal RF IN 34) passes through the attenuator 32 and therefore is attenuated according to the laser direct current, the amplification curve of the amplifier U2D and the attenuation vs. control voltage at the attenuator 32. Capacitors 22 and 23 are for noise reduction purposes.

The components shown in FIG. 2 are conventional, and all are not discussed herein; their values and/or commercial part numbers are shown in FIG. 2. Moreover the attenuator 32 (having two PIN diodes) and modulating amplifier 36 are each conventional. Generally, when the laser DC current increases, the attenuation goes down and the modulating signal supplied to the (push-pull) amplifier 36 increases and as a result so does the modulating current to the laser 12.

The attenuation of the attenuator 32 vs. its DC control voltage ($V_{TP-2}$) is in one embodiment a nonlinear function, and has a parabolic shape that can be approximated in one embodiment of the invention by e.g. two straight-line segments (a piecewise linear approximation). To compensate for this non-linearity, an opposite non-linearity is introduced in the PIN attenuator controller 30 such that the whole CNR loop gives accurate linear compensation along the entire expected laser DC current range. (Alternatively, the attenuator controller is linear.) The non-linearity in the attenuator controller circuitry is supplied by zener diode D10, and resistors R51, R35. At high DC laser currents the voltage at the lower side of resistor R36 is relatively low, the zener diode D10 is off and the gain of the attenuator controller is 1.5. At low DC laser currents, the zener diode D10 is on and the voltage from the lower side of resistor R36 is dynamically attenuated by approximately 20% before it reaches amplifier U2D pin 12. The total gain of the attenuator controller 30 is than: 1.5×0.8=1.2. This reduction in gain is necessary because at high control voltage ($V_{TP-2}$) the sensitivity of the attenuator 32 is higher than at low control voltages.

For instance, one wants to ensure that at 25° C. enough attenuation is available from the attenuator 32 such that at higher temperatures attenuation could be reduced, to increase the modulation current and will be sufficient to compensate for the loss of slope efficiency. If 6 db attenuation is available in the PIN attenuator 32 at 25° C., there will be full compensation at 85° C.; for this reason in one example potentiometer 38 (P2) is adjusted at 25° C. to obtain $V_{TP-2}$=5 V which is equivalent to 6 db attenuation. It should be noted that such manual adjustment of potentiometer 38 has to be done on each transmitter and hence a fixed divider cannot replace this potentiometer. The reason is that the initial DC laser current and therefore the voltage at the lower side of resistor R36 will vary from laser to laser even at 25° C. This voltage is an input to the attenuator controller 30 and the potentiometer 38 adjustment accounts for it.

Another reason for the adjustment is to make sure the break point between the two linear gain segments of the attenuator controller will occur at the same $V_{TP-2}$ and that it is independent of the initial laser direct current. Keeping the ratio of the resistances of resistors R59, R60, R34, R33, such that R59/R60=R34/R33 accomplishes this purpose.

Also advantageously in accordance with the invention, the operator can adjust the power (potentiometer 26 in FIG. 1) and have automatic modulation current compensation. In the prior art, any such change in power requires intervention by the operator to measure output using instrumentation and manually changing the modulation current.

This description is illustrative and not limiting; further modifications will be apparent to one skilled in the art in light of this disclosure and are intended to fall within the scope of the appended claims.

What is claimed:

1. A circuit for controlling modulation of a laser, the laser being driven by a control device including a source of direct current, the circuit comprising;
   a current sensor coupled to the laser to sense a direct current provided to the laser from the source of direct current; and
   a variable attenuator having a first control input terminal coupled to the current sensor, a second input terminal for receiving a varying signal, and an output terminal providing the varying signal which is attenuated, the attenuated signal being coupled to the laser; and,
   an attenuator controller coupled between the attenuator and the current sensor.

2. A circuit for controlling modulation of a laser, the laser being driven by a control device including a source of direct current, the circuit comprising;
   a current sensor coupled to the laser to sense a direct current provided to the laser from the source of direct current; and
   a variable attenuator having a first control input terminal coupled to the current sensor, a second input terminal for receiving a varying signal, and an output terminal providing the varying signal which is attenuated, the attenuated signal being coupled to the laser,
   wherein the attenuator includes at least one PIN diode.

3. The circuit of claim 1, wherein the attenuator controller controls the variable attenuation of the attenuator so as to maintain a constant carrier to noise ratio of an optical signal output by the laser.

4. The circuit of claim 1, wherein the attenuator controller controls the variable attenuation of the attenuator so as to maintain a constant optical modulation index of an optical signal output by the laser.

5. The circuit of claim 1, wherein the attenuator controller controls the amount of attenuation non-linearly with respect to the current level sensed by the current sensor.

6. The circuit of claim 1, wherein the attenuator controller controls the amount of attenuation linearly with respect to the current level sensed by the current sensor.

7. The circuit of claim 5, wherein the non-linearity is a piecewise approximation.

8. A laser transmitter comprising:
   a laser;
   a power control circuit which controls direct current for driving the laser, the power control circuit comprising;
      a sensor which senses an amount of radiation output by the laser;
      a control device coupled to the sensor; and
      a source of direct current coupled to the control device;
   a circuit for controlling the modulation of the laser, the circuit for controlling the modulation of the laser comprising;
      a current sensor coupled to the laser to sense a direct current provided to the laser from the source of direct current; and
      a variable attenuator having a first control input terminal coupled to the current sensor, a second input terminal for receiving a varying signal, and an output terminal providing the varying signal which is attenuated, the attenuated signal being coupled to the laser.

9. A method for controlling operation of a modulated laser, comprising the steps of:
   providing a variable direct current to the laser;
   sensing the variable direct current provided to the laser;
   receiving a modulation signal to modulate the laser;
   variably attenuating the modulation signal non-linearly in accordance with the sensed direct current; and
   coupling the attenuated modulation signal to drive the laser.

10. The method of claim 9, wherein the non-linearity is a piecewise approximation.

* * * * *